US011024559B2

(12) United States Patent
Heppner et al.

(10) Patent No.: US 11,024,559 B2
(45) Date of Patent: Jun. 1, 2021

(54) SEMICONDUCTOR PACKAGE WITH ELECTROMAGNETIC INTERFERENCE SHIELDING STRUCTURES

(71) Applicant: Intel Corporation, Santa Clara, CA (US)

(72) Inventors: Joshua Heppner, Chandler, AZ (US); Mitul Modi, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/579,116

(22) PCT Filed: Apr. 1, 2016

(86) PCT No.: PCT/US2016/025659
§ 371 (c)(1),
(2) Date: Dec. 1, 2017

(87) PCT Pub. No.: WO2017/171859
PCT Pub. Date: Oct. 5, 2017

(65) Prior Publication Data
US 2018/0166363 A1   Jun. 14, 2018

(51) Int. Cl.
*H01L 23/48*       (2006.01)
*H01L 23/552*      (2006.01)
(Continued)

(52) U.S. Cl.
CPC .......... *H01L 23/481* (2013.01); *H01L 21/768* (2013.01); *H01L 23/48* (2013.01);
(Continued)

(58) Field of Classification Search
CPC ..... H01L 23/481; H01L 23/48; H01L 23/552; H01L 25/0655; H01L 25/0657; H02L 21/768
(Continued)

(56) References Cited

U.S. PATENT DOCUMENTS 7,217,997 B2 * 5/2007 Wyland ................... H01L 23/04
                                                  257/707
8,012,868 B1 * 9/2011 Naval .................... H01L 23/552
                                                  257/784
(Continued)

FOREIGN PATENT DOCUMENTS

CN      109314100      2/2019
WO      2017171859     10/2017

OTHER PUBLICATIONS

"International Application Serial No. PCT/US2016/025659, International Search Report dated Nov. 21, 2016", 3 pgs.
(Continued)

*Primary Examiner* — Dao H Nguyen
(74) *Attorney, Agent, or Firm* — Schwegman Lundberg & Woessner, P.A.

(57) ABSTRACT

Semiconductor packages with electromagnetic interference (EMI) shielding structures and a method of manufacture therefor is disclosed. In some aspects, a shielding structure can serve as an enclosure formed by conductive material or by a mesh of such material that can be used to block electric fields emanating from one or more electronic components enclosed by the shielding structure at a global package level or local and/or compartment package level for semiconductor packages. In one embodiment, wire and/or ribbon bonding can be used to fabricate the shielding structure. For example, one or more wire and/or ribbon bonds can go from a connecting ground pad on one side of the package to a connecting ground pad on the other side of the package. This can be repeated multiple times at a pre-determined pitch necessary to meet the electrical requirements for shielding, e.g. less than or equal to approximately one half the wavelength of radiation generated by the electronic components being shielded.

17 Claims, 11 Drawing Sheets

(51) Int. Cl.
  *H01L 25/065* (2006.01)
  *H01L 21/768* (2006.01)

(52) U.S. Cl.
  CPC ........ *H01L 23/552* (2013.01); *H01L 25/0655* (2013.01); *H01L 25/0657* (2013.01); *H01L 2224/97* (2013.01); *H01L 2225/0651* (2013.01); *H01L 2225/06506* (2013.01); *H01L 2225/06537* (2013.01); *H01L 2924/19107* (2013.01)

(58) Field of Classification Search
  USPC ....... 257/503, 659, 678, 685, 691, 704, 706, 257/720, 660, E23.006, E23.013, 257/E23.024, E23.069, E23.079, E23.092, 257/E25.012, E25.021, E21.504, E21.575; 174/350, 366, 377, 388, 390; 361/220, 361/728, 818; 438/617, 622
  See application file for complete search history.

(56) References Cited

U.S. PATENT DOCUMENTS

| | | | | |
|---|---|---|---|---|
| 8,129,824 | B1* | 3/2012 | St. Amand | H01L 23/552 |
| | | | | 257/659 |
| 9,508,658 | B1* | 11/2016 | Convert | H01L 23/552 |
| 10,062,661 | B2* | 8/2018 | Sato | H01L 23/13 |
| 10,141,269 | B2* | 11/2018 | Jeon | H01L 23/552 |
| 2002/0121694 | A1* | 9/2002 | Gaynes | H01L 21/563 |
| | | | | 257/738 |
| 2003/0116836 | A1* | 6/2003 | Huang | H01L 23/3128 |
| | | | | 257/678 |
| 2005/0040501 | A1 | 2/2005 | Hagen | |
| 2009/0166781 | A1 | 7/2009 | England | |
| 2010/0213563 | A1 | 8/2010 | Lai | |
| 2014/0016277 | A1 | 1/2014 | Chen et al. | |
| 2015/0126139 | A1* | 5/2015 | Chen | H04B 1/44 |
| | | | | 455/78 |
| 2015/0223322 | A1* | 8/2015 | Ziglioli | H05K 1/0237 |
| | | | | 361/728 |
| 2016/0093577 | A1 | 3/2016 | Chen et al. | |
| 2018/0098416 | A1* | 4/2018 | Choi | H01F 27/362 |

OTHER PUBLICATIONS

"International Application Serial No. PCT/US2016/025659, Written Opinion dated Nov. 21, 2016", 9 pgs.

"Chinese Application Serial No. 201680083027.9, Voluntary Amendment filed Apr. 30, 2019", w English Claims, 8 pgs.

"International Application Serial No. PCT US2016 025659, International Preliminary Report on Patentability dated Oct. 11, 2018", 11 pgs.

"European Application Serial No. 16897398.0, Extended European Search Report dated Jan. 14, 2020", 9 pgs.

"European Application Serial No. 16897398.0, Response filed Jul. 29, 2020 to Extended European Search Report dated Jan. 14, 2020", 61 pgs.

* cited by examiner

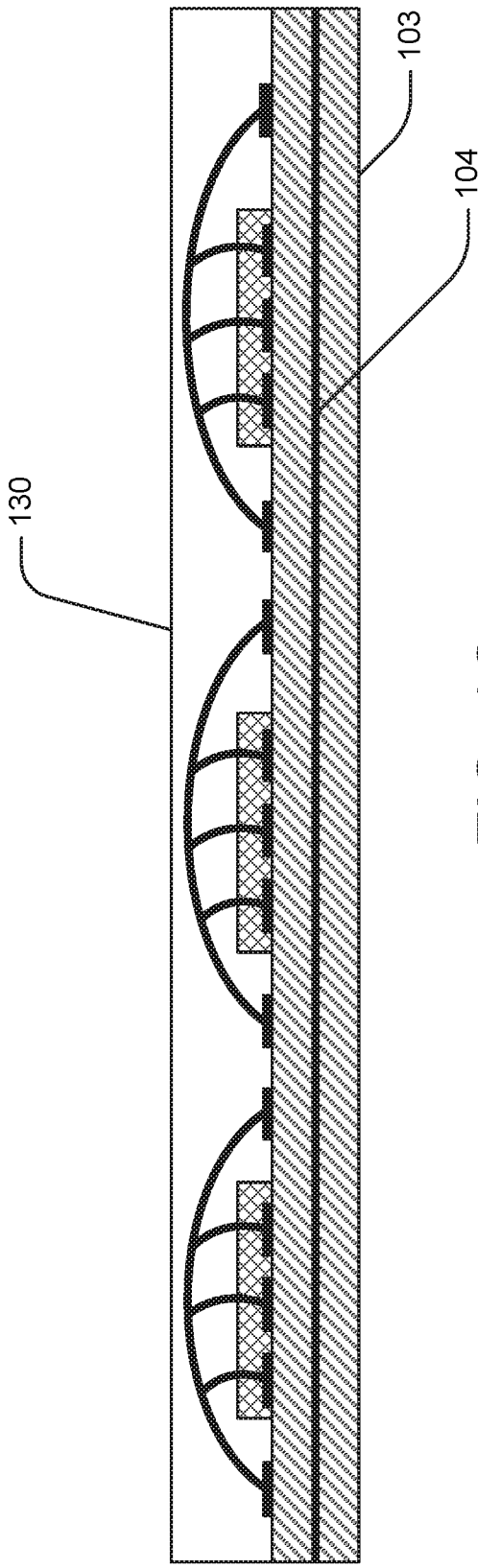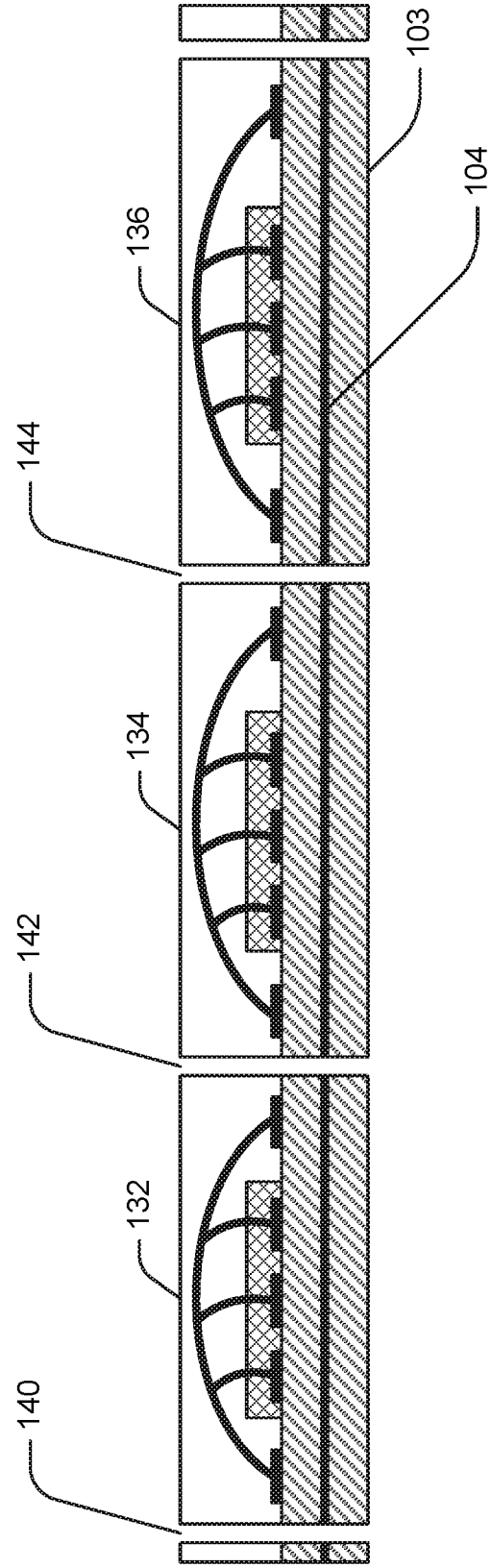

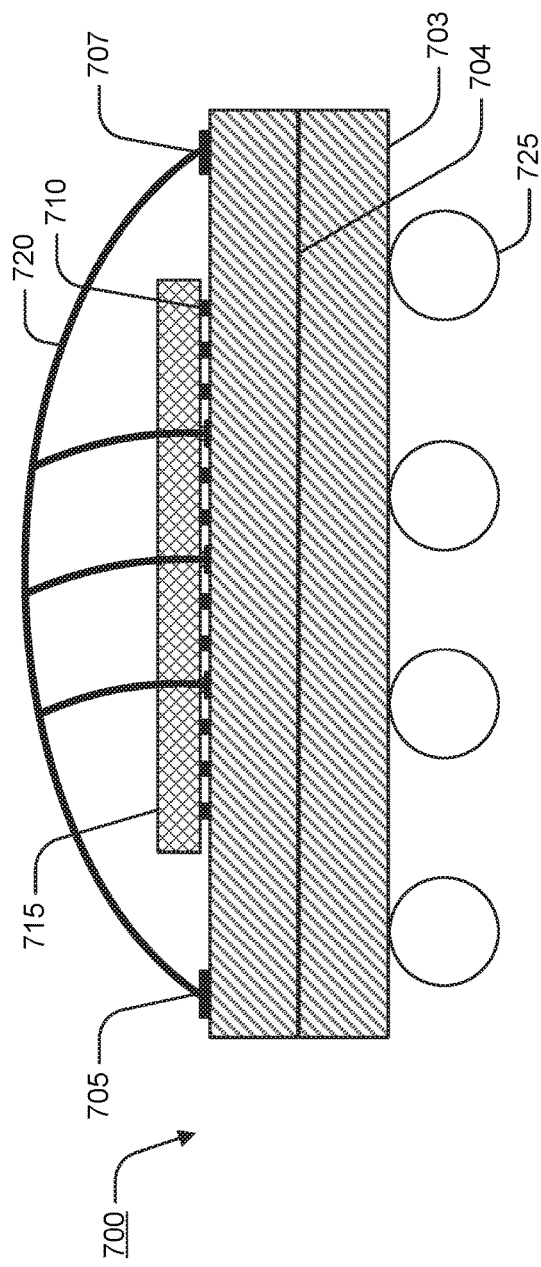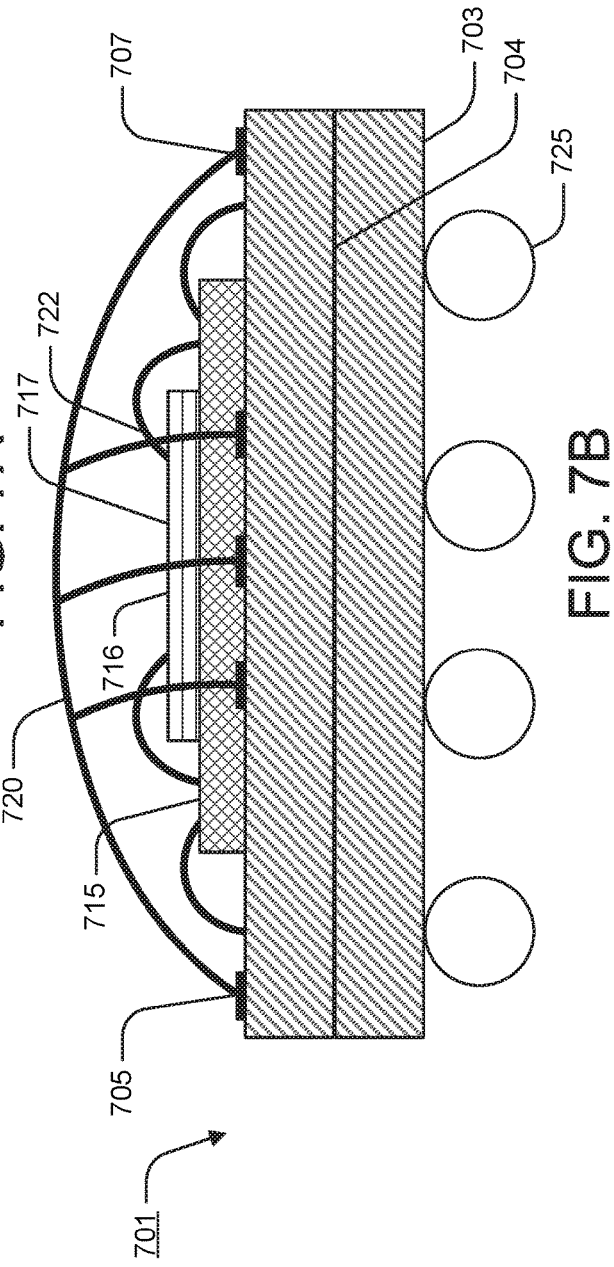

US 11,024,559 B2

SEMICONDUCTOR PACKAGE WITH ELECTROMAGNETIC INTERFERENCE SHIELDING STRUCTURES

PRIORITY APPLICATION

This application is a U.S. National Stage Application under 35 U.S.C. 371 from International Application No. PCT/US2016/025659, filed Apr. 1, 2016, published as WO 2017/171859, which is incorporated herein by reference in its entirety.

TECHNICAL FIELD

This disclosure generally relates to semiconductor packages, and more particularly to semiconductor packages with electromagnetic shielding structures.

BACKGROUND

Integrated circuit(s) and other electronic devices may be packaged on a semiconductor package. The semiconductor package may be integrated onto an electronic system, such as a consumer electronic system. In some cases, the integrated circuit(s) and/or electronic devices provided on the semiconductor package may interfere with each other or with other electronic components of a system in which the semiconductor package is integrated.

BRIEF DESCRIPTION OF THE FIGURES

Reference will now be made to the accompanying drawings, which are not necessarily drawn to scale, and wherein:

FIGS. 1A-1D depict simplified cross-sectional schematic diagrams of an example semiconductor package with a wire shielding structure and fabrication process, in accordance with example embodiments of the disclosure.

FIGS. 7A and 7B depict simplified cross-sectional schematic diagrams illustrating semiconductor packages having with electrical and mechanical coupling between the die and the semiconductor package and having an electromagnetic interference (EMI) shielding structure, in accordance with example embodiments of the disclosure.

DETAILED DESCRIPTION OF EMBODIMENTS OF THE DISCLOSURE

Figure 1A:
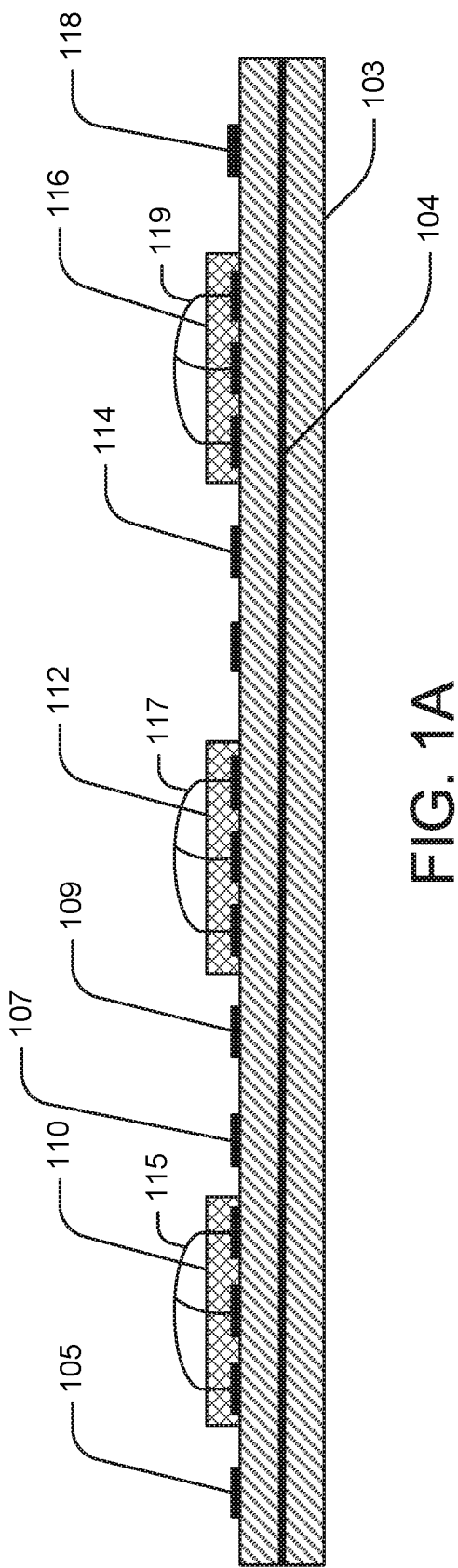

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, materials, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (e.g., surface of a substrate), regardless of its orientation. The term "vertical" as used herein may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane. The term "processing" as used herein includes deposition of material or photoresist, patterning, exposure, development, etching, cleaning, ablating, polishing, and/or the removal of the material or photoresist as required in forming a described structure.

Embodiments of the disclosure may provide a semiconductor package and a method for fabrication of the semiconductor package. In example embodiments, the semiconductor package may have one or more electromagnetic interference (EMI) shielding structures, as described herein. These semiconductor packages with the EMI shielding structures may be fabricated using the methods as disclosed herein.

In example embodiments, the semiconductor package structures may include a package substrate. In some cases, the package substrate may be an organic structure. In other cases, the package substrate may be inorganic (e.g., ceramic, glass, etc.). The package substrate may, in example embodiments, include a core layer with one or more interconnect layers built up on one or both sides of the core layer. In other example embodiments, the package substrate may be a coreless substrate. One or more electronic components, including at least one integrated circuit die, may be electrically and mechanically coupled to the package substrate via any suitable mechanism, such as metal pillars (e.g., copper pillars), flip chip bumps, solder bumps, any type of low-lead or lead-free solder bumps, tin-copper bumps, wire bonds, wedge bonds, controlled collapse chip connects (C4), anisotropic conductive film (ACF), nonconductive film (NCF), combinations thereof, or the like. Semiconductor package-to-board level interconnects may be provided on one or both sides of the package substrate. In example embodiments, the semiconductor package-to-board level interconnects may be ball grid array (BGA) connections.

The semiconductor package may have a ground layer provided on the surface of the semiconductor package, such as on the top interconnect layer of the semiconductor package, according to some example embodiments. In other example embodiments, the semiconductor package may have a ground plane formed in a layer that is within the package substrate, such as on the package core and/or a build-up layer that is not on the surface of the package substrate. Molding, to mechanically protect the electronic components, may be formed on top of the one or more electronic components on a surface of the semiconductor package. Semiconductor package-to-board level interconnects may be provided on one or both sides of the package substrate.

The processes, as depicted herein, may be implemented to concurrently or nearly concurrently fabricate a plurality of semiconductor packages with EMI shielding. The semiconductor package may be fabricated with any variety of processes or sequences thereof. Although a particular fabrication sequence is shown here with fabrication of various structures and/or features, both final and/or temporary, any variations for fabricating similar features may be implemented in accordance with example embodiments of the disclosure. Further still, there may be additional and/or fewer features than the features disclosed herein for the fabrication of the semiconductor package, in accordance with example embodiments of the disclosure. Although the cross-sections as depicted here show a particular number of semiconductor packages fabricated concurrently on a package substrate panel, it will be appreciated that there may be any number of semiconductor packages that are fabricated concurrently or nearly concurrently on a particular package substrate panel. Additionally, although an example embodiment of the sequence of processes for fabricating a semiconductor package with EMI shielding is depicted, it will be appreciated that there may be any number of package substrate panels that may be processed concurrently and/or near concurrently through any of the processes depicted herein. For example, some processes may be batch processes where a particular unit (e.g., package substrate panel) may be processed along with another of that unit. In other cases, unit processes may be performed in a sequential manner on work-in-progress (WIP).

Disclosed herein are systems and methods to provide EMI shielding on semiconductor packages. In some aspects, a shielding structure can serve as an enclosure formed by conductive material or by a mesh of such material that can be used to block electric and/or magnetic fields emanating to/from one or more electronic components enclosed by the shielding structure at the package level. In one embodiment, wire and/or ribbon bonding may be used to fabricate the shielding structure. For example, one or more wire and/or ribbon bonds may be provided from a connecting ground pad on one side of the package to a connecting ground pad on the other side of the package. This can be repeated multiple times with a pre-determined density. In example embodiments, the predetermined density of the wire and/or ribbon bonds may be designed to meet the electrical and/or magnetic requirements for shielding, e.g., less than or equal to approximately one half the wavelength of radiation generated by the electronic components being shielded. Moreover, attaching each of the terminations of the wires to a connection ground pad may create a ground shield that may dissipate the external energy that would otherwise interfere with signal integrity, thus providing local and/or global shielding. The systems and methods can have a minimal footprint and may be done directly on the semiconductor substrate before singulation.

The semiconductor package structures, as disclosed herein, may thus have one or more wirebonds and/or ribbons attached to and protruding from the surface of the a semiconductor substrate and surrounding one or more electronic components (e.g., integrated circuits, etc.) provided on the semiconductor substrate. These wirebonds and/or ribbons may have a density of placement (e.g., pitch, overlap, bond distance, etc.) designed to reject a predetermined range of frequencies/wavelengths of electromagnetic noise and/or interference. In some example embodiments, the wirebonds and/or ribbons disposed on the surface of the semiconductor package may for a cage around one or more of the integrated circuits disposed on the semiconductor package.

In some example embodiments, a plurality of wirebonds and/or ribbons attached to ground pads may be disposed around a periphery of a semiconductor package and/or one or more integrated circuits. After the formation of the grounded wirebonds and/or ribbons, the semiconductor package surface, along with the electronic components disposed thereon may be encapsulated in molding. Portions (e.g., tips) of the grounded wirebonds and/or ribbons may be exposed through the top surface of the molding. Next, a layer of metal may be disposed on top of the molding and contacting the exposed portions of the grounded wirebonds and/or ribbons. Thus the combination of the top metal overlying the molding and the grounded wirebonds and/or ribbons may provide a Faraday cage around one or more integrated circuits of the semiconductor package that may be suitable for rejecting a targeted electromagnetic interference. The top metal of this type of an EMI shield may be deposited by any suitable mechanism including, but not limited to, metal foil lamination, physical vapor deposition, chemical vapor deposition, sputtering, metal paste deposition, combinations thereof, or the like.

FIGS. 1A-1D generally show a cross-sectional view of a substrate, electronic components (alternatively referred to as dies throughout), and a wire shielding structure in accordance with various aspects of the disclosure. FIG. 1A shows the substrate 103 having an embedded ground plane 104, example one or more electronic components 110, 112, and 116 (collectively referenced by 110 henceforth unless explicitly stated otherwise), and example one or more ground connection pads 105, 107, 109, 111, 114, and 118 and ground connection pads in the perpendicular direction with respect to the current angle of view 115, 117, and 119 (collectively referenced by 105 henceforth unless explicitly stated otherwise). While three electronic components 110, 112, and 116 are shown here for illustrative purposes, it is to be understood that there can be greater or fewer number of electrical components. The ground connection pads 105 may be electrically connected to the embedded ground plane 104. The ground connection pads 105 may serve to make electrical connection to a wire shielding structure, as will be elaborated in later figures and related discussion.

In various embodiments, the semiconductor package substrate 103 may be of any suitable size and/or shape. For example, the semiconductor package substrate 103, in example embodiments, may be a rectangular panel. In example embodiments, the semiconductor package substrate 103 may be fabricated of any suitable material, including polymer material, ceramic material, plastics, composite materials, glass, epoxy laminates of fiberglass sheets, FR-4 materials, FR-5 materials, combinations thereof, or the like. The substrate may have a core layer and any number of interconnect build-up layers on either side of a core layer. The core and/or the interconnect build-up layers may be any variety of the aforementioned materials and, in some example embodiments, may not be constructed of the same material types. It will be appreciated that the build-up layers may be fabricated in any suitable fashion. For example a first layer of build-up interconnect may include providing a package substrate core, with or without through holes formed therein. Dielectric laminate material may be laminated on the semiconductor substrate core material. Vias and/or trenches may be patterned in the build-up layer using any suitable mechanism, including photolithography, plasma etch, laser ablation, wet etch, combinations thereof, or the like. The vias and trenches may be defined by vertical and horizontal metal traces, respectively within the build-up layer. The vias and trenches may then be filled with metal, such as by electroless metal plating, electrolytic metal plating, physical vapor deposition, combinations thereof, or the like. Excess metal may be removed by any suitable mechanism, such as etch, clean, polish, and/or chemical mechanical polish (CMP), combinations thereof, or the like. Subsequent build-up layers (e.g., higher levels of build-up layers) on either side of the core may be formed by the same aforementioned processes.

The ground plane 104 may be, in example embodiments, a build-up layer (e.g., a build-up layer with interconnects) within the semiconductor package substrate 103. When the final package substrate with the EMI shielding is in operation, the ground plane may be shorted to ground, such as on a printed circuit board (PCB) on which the final package substrate with EMI shielding is disposed. The ground plane may be electrically connected, in example embodiments, to one or more ground connection pads 105. The ground connection pads 105 may be one or more pads and/or interconnect traces (e.g., surface wiring traces) on the top surface of the semiconductor package substrate 103.

The semiconductor package substrate 103 may have one or more electronic components or devices 110 disposed thereon. As mentioned, although for illustrative purposes, only one electronic component 110 per semiconductor package substrate 100 is depicted in FIGS. 1A-1D, it will be appreciated that there may be any suitable number of electronic components 110 disposed in each semiconductor package with EMI shielding, in accordance with example embodiments of the disclosure. The electronic components 110 may be any suitable electronic components, including, but not limited to, integrated circuits, surface mount devices, active devices, passive devices, diodes, transistors, connectors, resistors, inductors, capacitors, microelectromechanical systems (MEMSs), combinations thereof, or the like. The electronic components 110 may be electrically and mechanically coupled to the semiconductor package substrate 103 via any suitable mechanism, such as metal pillars (e.g., copper pillars), flip chip bumps, solder bumps, any type of low-lead or lead-free solder bumps, tin-copper bumps, wire bonds, wedge bonds, controlled collapse chip connects (C4), anisotropic conductive film (ACF), nonconductive film (NCF), combinations thereof, or the like.

In some embodiments, the spacing of the electronic devices 110, 112, and 116 from one another may be pre-determined to be in compliance with one or more industrial standards. The spacing of the electronic devices 110 to the ground connection pads 105 may also be pre-determined to comply with one or more industrial standards. The height of the semiconductor chips may be predetermined to conform to one or more processes being executed. The ground connection pads 105 may each be connected to electrical traces (not shown), and may be connected to the embedded ground plane 104.

Figure 1B:
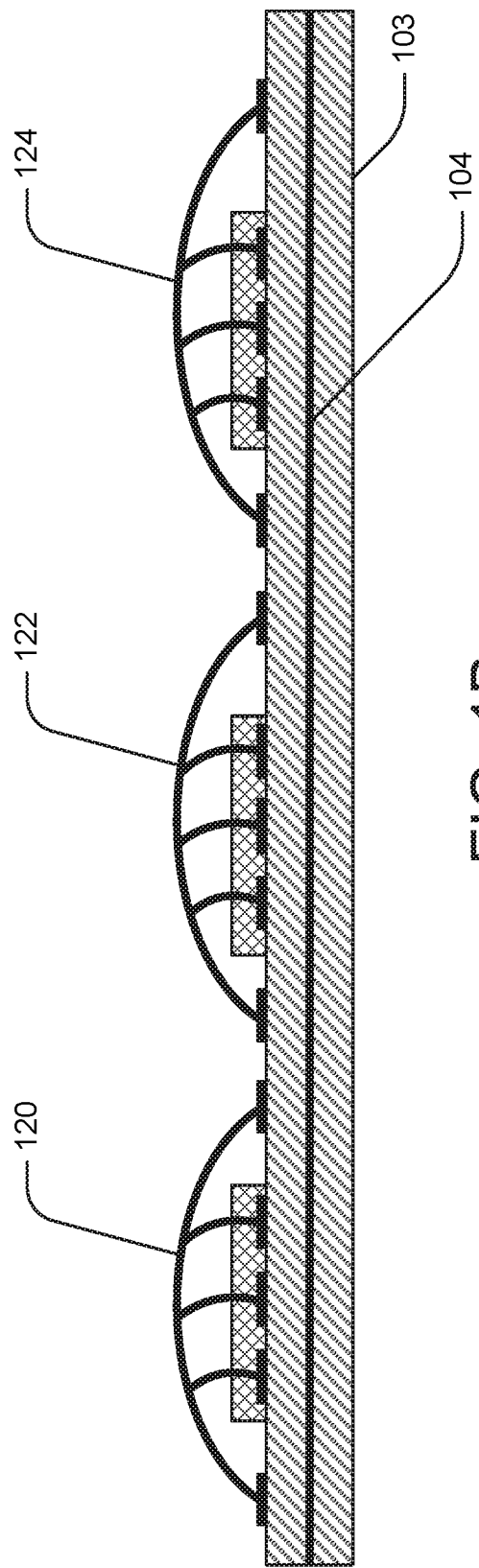

FIG. 1B represents the continuation of FIG. 1A with an added wire shielding structures 120, 122, and 124 enclosing the chips 110, 112, and 116, respectively. The wire shielding structures 120, 122, and 124 (collectively referenced by 120 henceforth unless explicitly stated otherwise) may be fabricated by boding, for example, by wire bonding, direct bonding, plasma activated bonding, anodic bonding, eutectic bonding, adhesive bonding, thermo compression bonding, reactive bonding, and the like. In one embodiment, the wire shielding structures 120 may be prefabricated and then attached to the substrate via a pick and place technique. The wire shielding structures 120 can be interfaced to the substrate by its connection to the ground connection pads 105. The connection may be characterized, for example, by a copper/silver metallurgy where the wire comprises copper, and the ground pads comprise silver. In other example embodiments the wire can comprise gold, silver, or copper, aluminum, and/or other, suitable metals and combinations thereof. Moreover, the wire shielding structure can be fabricated using any suitable mechanism and/or metallurgy. In an example fabrication, a wire nozzle with a heated tip may be used to position the wire over a connecting ground connection pad 105 to fuse the wire onto the pad. Then the wire may be drawn in a fashion where the wire is relatively straight and vertical for a predetermined distance (e.g., the final height of the dies 110, etc.) and then bent to make a second wirebond to another bondpad or dummy surface (e.g., a temporary and/or sacrificial coupon provided above or below the die 110 during fabrication).

The height of the wire shielding structure 120 may, in some embodiments, exceed the height of the semiconducting chips 110 by a relatively small margin. In such, implementations a form factor of a final semiconductor package with EMI structure may be minimized. The diameter of the wires can be approximately in the range of about 5 microns ($\mu m$) to about 100 millimeter (mm) with example diameters/radius being approximately 1 mm. The pitch of the wire shielding structure 120 can be approximately 20 $\mu m$ to approximately 100 mm. In example aspects, the pitch of the grid may be such that dimension of the largest gap in the grid is approximately smaller than or equal to approximately one half the wavelength of the radiation emanating from the protected chip. In some aspects, not all of the chips 110 (and others, not shown) are covered by the wire shielding structure 120.

FIG. 1C represents the continuation of FIG. 1B with an added molding layer 130. The molding layer 130 can provide for structural support of the wire shielding structure 120 and for environmental protection. In some aspects, transfer molding can be used to add the molding layer 130.

In other aspects, the molding layer 130 can be made partially or fully from a molding compound which may be any suitable molding material. For example, the molding compound may be a liquid dispensed thermosetting epoxy resin molding compound. The molding compound may be deposited on the surface of the stacked die package 110 using any suitable mechanism including, but not limited to, liquid dispense, spin coating, spray coating, combinations thereof, or the like.

The molding compound, after being dispensed onto the top surface of the substrate 103, may be cured while pressure is applied thereon by a chase surface. In example embodiments, the chase (e.g., a relatively flat surface pressed on top of the liquid molding material disposed on top of the substrate 103) may itself be heated. Upon curing (e.g., cross-linking) the deposited molding compound may harden and form a molding layer 130 to adhere to the substrate 103 and encapsulating the electronic components 110. In example embodiments, the molding layer 130 may have fillers and/or other materials therein to preferentially control the coefficient of thermal expansion (CTE), reduce stresses, impart flame retardant properties, promote adhesion, and/or reduce moisture uptake in the molding layer 130. The molding layer 130, in example embodiments, may be any suitable thickness. For example, the molding layer 130 may be approximately 1 mm thick. In other cases, the molding 130 may be approximately in the range between about 200 μm and 800 μm thick. In yet other cases, the molding layer 130 may be approximately in the range between about 1 mm and about 2 mm thick.

Process parameters can be optimized to ensure the complete fill of the mold cavity and the elimination of voids in the mold compound. Depending on the dimensions of the wire shielding structure 120, the mold process can be further optimized to prevent wire sweep that can result in electrical shorts inside the package. Process parameters that are controlled include the transfer rate, temperature, and pressure. The final cure cycle (temperature and time) can be pre-determined to ensure the reliability of the molded package. The height of the molding layer 130 can be comparable to (e.g. with approximately 10 μm to approximately 100 μm) the height of the wire shielding structure 120 or exceed the height of the wire shielding structure 120 (e.g. greater than approximately 10 μm to approximately 100 μm).

FIG. 1D depicts a schematic cross-section of the example semiconductor package with the wire shielding structures 120 that has been singulated to form individual semiconductor packages 132, 134, and 136 having EMI shielding, in accordance with example embodiments of the disclosure. In particular, the figure shows the singulation of the various electronic components 110 and the respective wire shielding structures 120 connected to respective ground connection pads 105. Each singulated structure 132, 134, and 136 can be considered a self-contained electrical unit, with its own electronic components 110 and wire shielding structure 120. The individual semiconductor packages, as fabricated on the substrate 103, may be singulated by cutting through the edges of each individual semiconductor package to provide a separation 140, 142, and 144 therebetween. The singulation may be performed using laser ablation, saw, or any other suitable mechanism.

Figure 2:
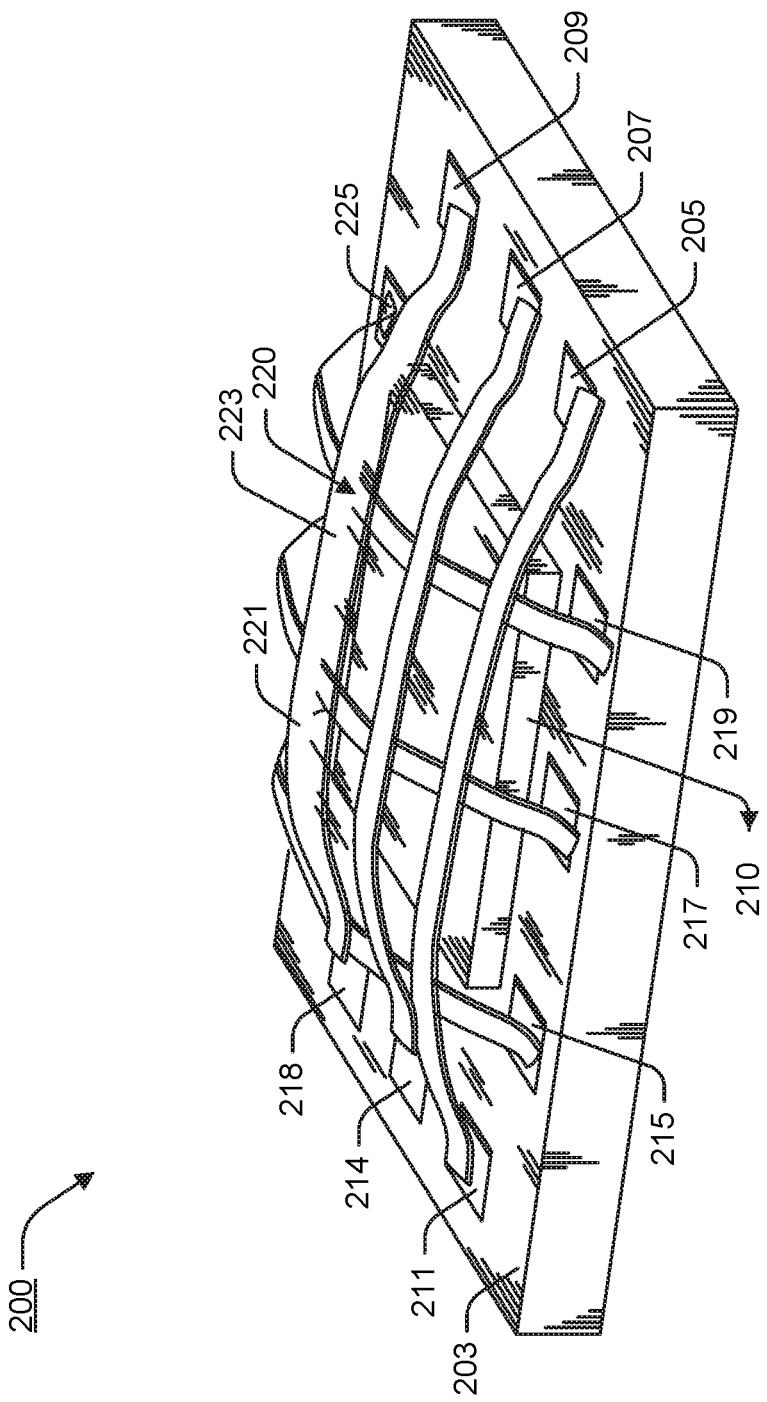
FIG. 2 depicts a simplified perspective view of an example semiconductor package with a wire shielding structure, in accordance with example embodiments of the disclosure.

FIG. 2 shows a simplified three-dimensional depiction of semiconductor package with EMI shielding 200 having substrate 203, an electronic component 210, and the shielding structure for the electronic component 210. In particular, FIG. 2 shows the wire shielding structure 220 electrically attached to a substrate 203 having an embedded ground plane 204 (not shown), an example electronic component 210, and example ground connection pads 205, 207, 209, 211, 214, and 218 and group connection pads in the perpendicular direction 215, 217, and 219 with respect to the current angle of view (collectively referenced by 205 henceforth unless explicitly stated otherwise). While one electronic component 210 is shown here for illustrative purposes, it is to be understood that there can be greater or fewer number of electrical components. The ground connection pads 205 can be electrically connected to the embedded ground plane 204 (not shown). The ground connection pads 205 serve for making electrical connection to the wire shielding structure 220.

Figure 3:
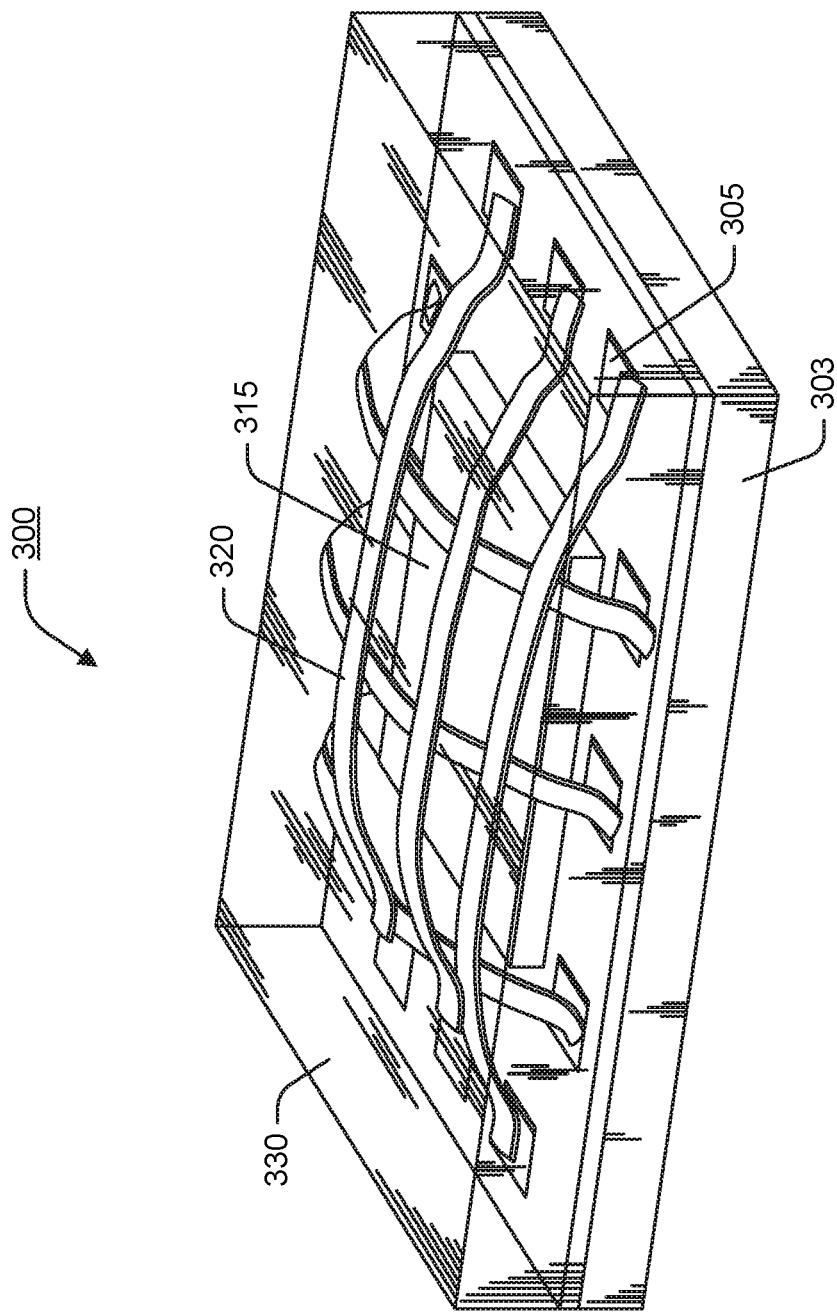
FIG. 3 depicts a simplified perspective view of an example semiconductor package with a wire shielding structure and a molding layer, in accordance with example embodiments of the disclosure.

FIG. 3 shows a simplified three-dimensional depiction of semiconductor package with EMI shielding 300 having molding layer 330 provided on top of the substrate 303, an electronic component 315, and the wire shielding structure 320 for the electronic component 315. In some embodiments, the molding layer 330 may provide structural support of the wire shielding structure 320 and for environmental and/or physical protection. In some aspects, transfer molding may be used to add the molding layer 330. In other aspects, the molding layer 330 can be made partially or fully from a molding compound which may be any suitable molding material. The molding layer 330, in example embodiments, may be any suitable thickness. For example, the molding layer 330 may be approximately 1 mm thick. In other cases, the molding layer 330 may be approximately in the range between about 200 μm and 800 μm thick. In yet other cases, the molding layer 330 may be approximately in the range between about 1 mm and about 2 mm thick. In one embodiment, the mold thickness can be between about 800 um to 1 mm an/or also greater than about 2 mm.

Figure 4A:
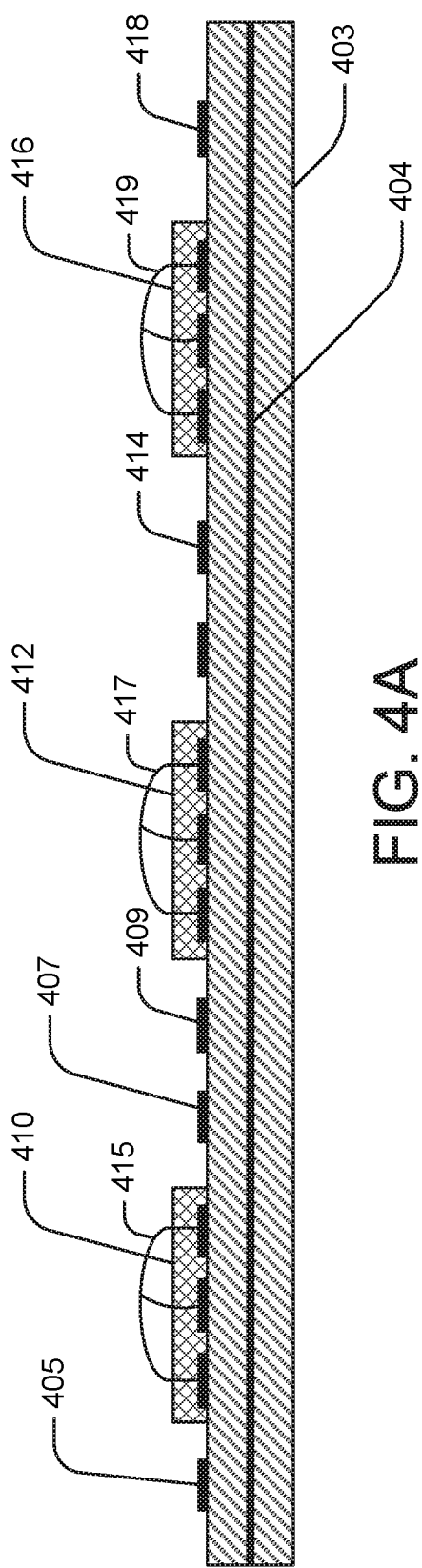
FIGS. 4A-4D depict simplified cross-sectional schematic diagrams of an example semiconductor package with a ribbon shielding structure and fabrication process, in accordance with example embodiments of the disclosure.

FIG. 4A-4D generally shows simplified cross-sectional views of the substrate 403, electronic components, and the ribbon shielding structure. In particular, FIG. 4A shows the substrate 403 having an embedded ground plane 404, example chips 410, 412, and 416 (collectively referenced by 410 henceforth unless explicitly stated otherwise), and example ground connection pads 405, 407, 409, 411, 414, and 418 and group connection pads in the perpendicular direction 415, 417, and 419 (collectively referenced by 405 henceforth unless explicitly stated otherwise). The ground connection pads 405 can be electrically connected to the embedded ground plane 404. The substrate 403 may be of any suitable size and/or shape. For example, the substrate 403, in example embodiments, may be a rectangular panel. In example embodiments, the semiconductor package substrate 403 may be fabricated of any suitable material, including polymer material, ceramic material, plastics, composite materials, glass, epoxy laminates of fiberglass sheets, FR-4 materials, FR-5 materials, combinations thereof, or the like. The substrate may have a core layer and any number of interconnect build-up layers on either side of a core layer. The core and/or the interconnect build-up layers may be any variety of the aforementioned materials and, in some example embodiments, may not be constructed of the same material types. It will be appreciated that the build-up layers may be fabricated in any suitable fashion. For example a first layer of build-up interconnect may include providing a package substrate core, with or without through holes formed therein. Dielectric laminate material may be laminated on the semiconductor substrate core material. Vias and/or trenches may be patterned in the build-up layer using any suitable mechanism, including photolithography, plasma etch, laser ablation, wet etch, combinations thereof, or the like. The vias and trenches may be defined by vertical and horizontal metal traces, respectively within the build-up layer. The vias and trenches may then be filled with metal, such as by electroless metal plating, electrolytic metal plating, physical vapor deposition, combinations thereof, or the like. Excess metal may be removed by any suitable mechanism, such as etch, clean, polish, and/or chemical mechanical polish (CMP), combinations thereof, or the like. Subsequent build-up layers (e.g., higher levels of build-up layers) on either side of the core may be formed by the same aforementioned processes.

The spacing of the electronic devices 410 may be pre-determined to comply with one or more industrial standards. The spacing of the electronic devices 410 to the ground connection pads 405 may also be pre-determined to comply with one or more industrial standards. The height of the semiconductor chips may be predetermined, to conform with one or more processes being executed. The ground connection pads 405 may each be connected to electrical traces (not shown), and may be connected to the embedded ground plane 404.

The ground plane 404 may be, in example embodiments, a build-up layer (e.g., a build-up layer with interconnects) within the substrate 403. When the final package substrate with the EMI shielding is in operation, the ground plane may be shorted to ground, such as on a printed circuit board (PCB) on which the final package substrate with the ribbon shielding structure is disposed. The ground plane may be electrically connected, in example embodiments, to one or more ground connection pads 405. The ground connection pads 405 may be one or more pads and/or interconnect traces (e.g., surface wiring traces) on the top surface of the substrate 403.

The substrate 403 may have one or more electronic components or devices 410 disposed thereon. Although for illustrative purposes, only three electronic component 410 per substrate 400 is depicted in FIGS. 4A-4D, it will be appreciated that there may be any suitable number of electronic components 410 disposed in each semiconductor package with respective ribbon shielding structures, in accordance with example embodiments of the disclosure. The electronic components 410 may be any suitable electronic components 410 including, but not limited to, integrated circuits, surface mount devices, active devices, passive devices, diodes, transistors, connectors, resistors, inductors, capacitors, microelectromechanical systems (MEMSs), combinations thereof, or the like. The electronic components 410 may be electrically and mechanically coupled to the semiconductor package substrate 403 via any suitable mechanism, such as metal pillars (e.g., copper pillars), flip chip bumps, solder bumps, any type of low-lead or lead-free solder bumps, tin-copper bumps, wire bonds, wedge bonds, controlled collapse chip connects (C4), anisotropic conductive film (ACF), nonconductive film (NCF), combinations thereof, or the like.

Figure 4B:
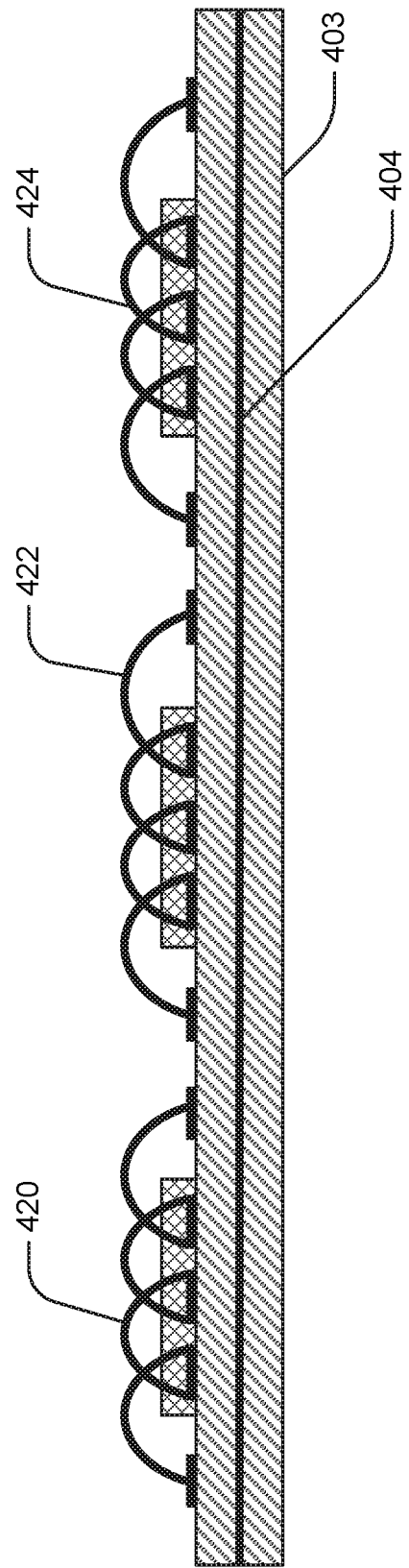

FIG. 4B represents the continuation of FIG. 4A with an added ribbon shielding structure 420 (collectively referenced by 420 henceforth unless explicitly stated otherwise) covering the electronic components and/or dies 410. The ribbon shielding structure 420 can be fabricated, for example, by ribbon bonding, direct bonding, plasma activated bonding, anodic bonding, eutectic bonding, adhesive bonding, thermo compression bonding, reactive bonding, and the like. In one embodiment, the ribbon shielding structure 420 can be prefabricated and then attached to the substrate via a pick and place technique. The ribbon shielding structure 420 directly interfaces to the substrate 403 by its connection to the ground connection pads 405. The connection can be characterized, for example, by a copper/silver metallurgy, where the ribbon comprises copper, and the ground pads comprise silver. In other example embodiments the ribbon can comprise gold, silver, or copper, aluminum, and/or other, suitable metals and combinations thereof. The height of the ribbon shielding structure 420 can, in some embodiments, just exceed the height of the electronic components and/or dies 410. The diameter of the ribbon can be approximately 10 µm to approximately 100 mm, with an example diameter being approximately 1 mm. The pitch of the ribbon shielding structure 420 can be approximately 100 micrometers. In example aspects, the ribbon shielding structure can have a largest gap dimension smaller than or equal to approximately one half the wavelength of the radiation emanating from the shielded electronic component. In some aspects, not all of the electronic components 410, 412, and 416 (and others, not shown) are covered by the ribbon shielding structure 420.

Figure 4C:
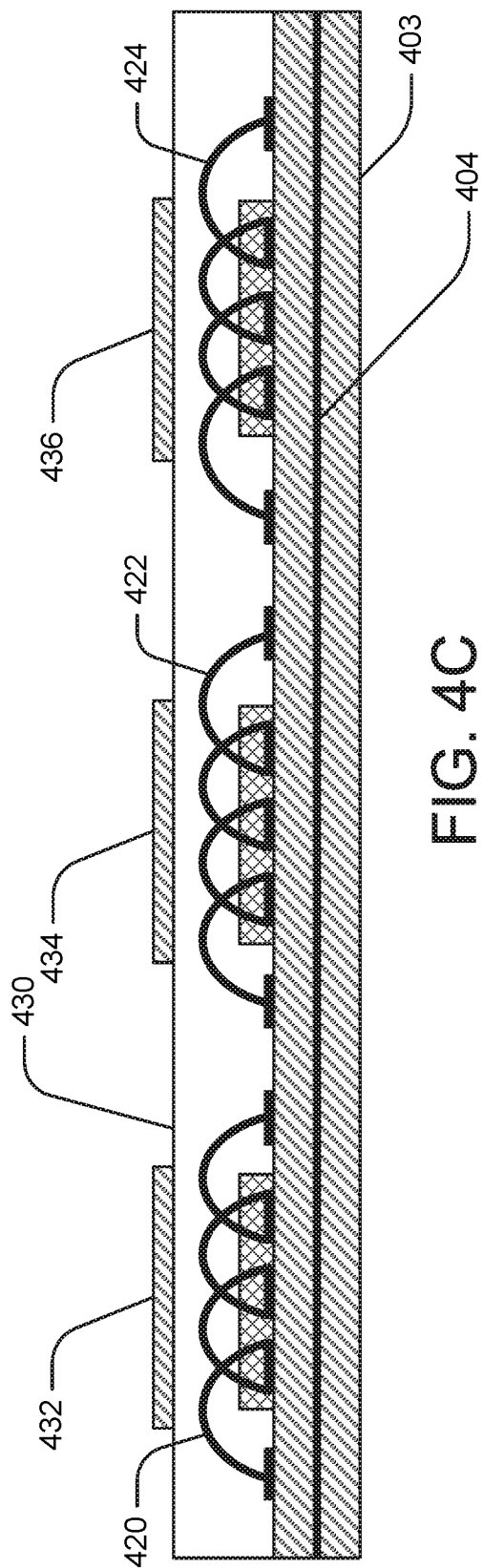

FIG. 4C represents the continuation of FIG. 4B with an added molding layer 430, for structural support of the ribbon shielding structure 420, 422, 424 and for environmental protection in addition to a metal layers 432, 434, 436 (collectively referred to herein as 432 unless explicitly stated otherwise) on top of the molding layer 430. In some aspects, transfer molding can be used for the molding layer. Process parameters can be optimized to reduce and/or eliminate voids in the mold compound. Depending on the dimensions of the ribbon shielding structure 420, the mold process may be further optimized to prevent ribbon sweep that can result in electrical shorts inside the package. Process parameters that are controlled include the transfer rate, temperature, and pressure. The final cure cycle (temperature and time) can be pre-determined to ensure the reliability of the molded package. The height of the molding layer 430 can be comparable to (e.g. within approximately 10 µm to approximately 100 µm) the height of the ribbon shielding structure 420 or exceed the height of the ribbon shielding structure 420 (e.g. greater than approximately 10 µm to approximately 100 µm).

The molding layer 430 can be made partially or fully from a molding compound which may be any suitable molding material. For example, the molding compound may be a liquid dispensed thermosetting epoxy resin molding compound. The molding compound may be deposited on the surface of the electronic devices 410 using any suitable mechanism including, but not limited to, liquid dispense, spin coating, spray coating, combinations thereof, or the like. The molding compound may be cured using a heated chase and/or in a heated environment, in accordance with example embodiments of the disclosure. The curing process may drive cross-linking and/or hardening of the molding compound to form the molding. In example embodiments, the molding may have fillers and/or other materials therein to preferentially control the coefficient of thermal expansion (CTE), reduce stresses, impart flame retardant properties, promote adhesion, and/or reduce moisture uptake in the molding layer 430. The molding layer 430, in example embodiments, may be any suitable thickness.

The molding compound, after being dispensed onto the top surface of the substrate 403, may be cured while pressure is applied thereon by a chase surface. In example embodiments, the chase (e.g., a relatively flat surface pressed on top of the liquid molding material disposed on top of the substrate 403) may itself be heated. Upon curing (e.g., cross-linking) the deposited molding compound may harden and form a molding layer 430 to adhere to the substrate 403 and encapsulating the electronic components 410. In example embodiments, the molding layer 430 may have fillers and/or other materials therein to preferentially control the coefficient of thermal expansion (CTE), reduce stresses, impart flame retardant properties, promote adhesion, and/or reduce moisture uptake in the molding layer 430. The molding layer 430, in example embodiments, may be any suitable thickness. For example, the molding layer 430 may be approximately 1 mm thick. In other cases, the molding 408 may be approximately in the range between about 200 µm and 800 µm thick. In yet other cases, the molding 108 may be approximately in the range between about 1 mm and 2 mm thick.

In some embodiments, the metal layer 432 can be in electrical connection with the ribbon shielding structures 420. The metal layer 432 may be laminated on top of the molding layer 430. The metal layer 432 or metal laminate may be of any suitable material. In some example embodiments, the metal layer 432 may be a copper sheet. In other example embodiments, the metal layer 432 may be a gold sheet, a tin sheet, a silver sheet, combinations thereof, or the like. The metal sheet may be of any suitable thickness. In example embodiments, the metal layer 432 may be approximately in a range of about 25 µm to about 500 µm.

In various embodiments, the metal layer 432 can be 10 µm to approximately 100 µm thick, with example thicknesses of approximately 1 mm. The metal layer 432 can comprise aluminum, silver, copper, and the like, and/or an alloy of aluminum, silver, copper, and the like. The metal layer can be deposited via sputtering, paste printing, squeegee, atomic layer deposition (ALD), or a variety of different physical vapor deposition (PVD) techniques. The metal layer 432 may be laminated on top of the molding layer 430 by any suitable process, including, for example, cold roll or hot roll. In example embodiments, the metal layer 432 may be hot pressed on top of the molding layer 430 at a temperature and pressure such that the lamination is performed concurrently with curing the molding layer 430. Additionally the metal layer can be deposited via any of the above mentioned techniques (or others that are not explicitly named herein) and then picked and placed on the molding layer 430, or laminated thereon, or positioned atop the molding layer 430 via any other technique.

Figure 4D:
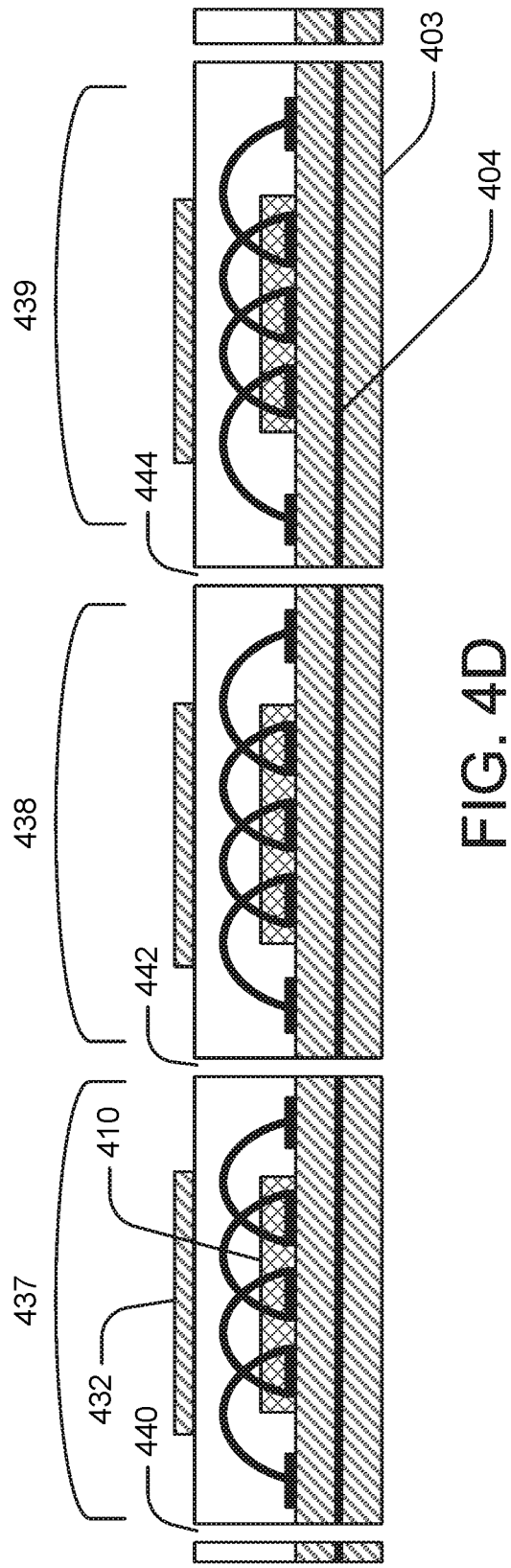

FIG. 4D depicts a schematic cross-section of the example semiconductor package with the ribbon shielding structure that has been singulated to form individual semiconductor packages with electromagnetic interference shielding, in accordance with example embodiments of the disclosure. In particular the figure shows the singulation 440, 442, and 444 of the various electronic components 410, 412, and 416 and the respective ribbon shielding structures 420, 422, and 424 connected to respective ground connection pads 405, 407, 409, 411, 414, and 418. Each singulated structure 437, 438, and 439 can be considered a self-contained electrical unit, with its own electronic components and/or dies and ribbon shielding structure. The individual semiconductor packages, as fabricated on the substrate 403, may be singulated by cutting through the edges of each individual semiconductor package to provide separation 440, 442, and 444 therebetween. The singulation may be performed using laser ablation, saw, or any other suitable mechanism.

In some embodiments, the metal layer 432 can be deposited via any of the above mentioned techniques (or others that are not explicitly named herein) after singulation. This may be done, for example, so that the deposition of the metal layer 432 can additionally provide material coverage of the various side wall of the singulated package.

In some embodiments (not shown), the shielding structure may include a combination of wire and ribbon shielding. For example, the outer perimeter of the electronic component or die may include a ribbon structure, and wire structure can provide a grid structure on top of the electronic component or die (e.g. instead of the metal layer). Alternatively, the outer perimeter of the chip may include a wire structure, and the top of the electronic component or die can be covered with a metal layer. This and other combinations of the wire, ribbon, and metal layer can be contemplated in various embodiments.

Figure 5:
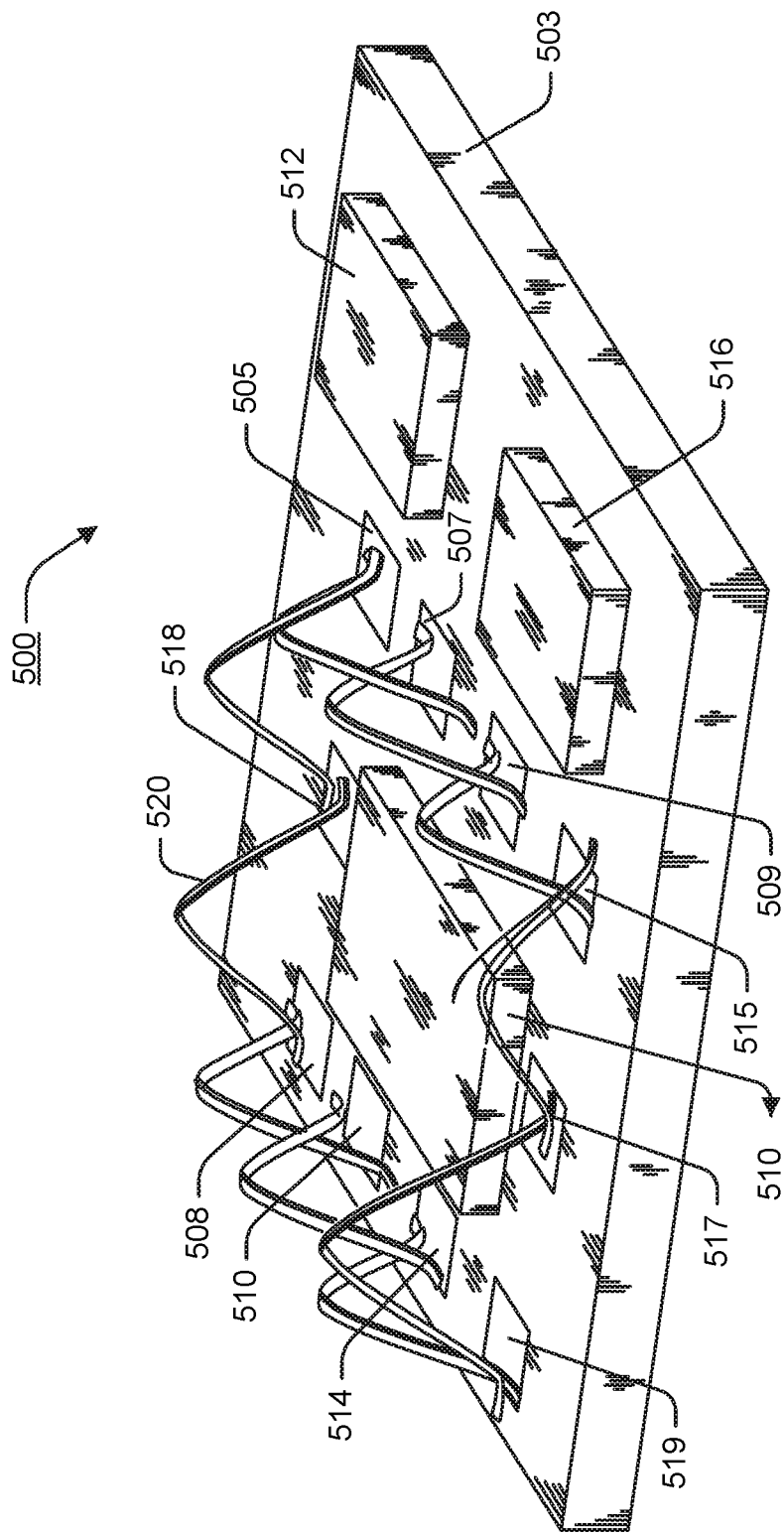
FIG. 5 depicts a simplified perspective view of an example semiconductor package with a ribbon shielding structure, in accordance with example embodiments of the disclosure.

FIG. 5 shows a three-dimensional rendition 500 of the substrate 503, an electronic component 510, and the shielding structure for the electronic component 510. In particular, FIG. 5 shows the ribbon shielding structure 520 electrically attached to a substrate 503 having an embedded ground plane 504 (not shown), an example electronic component 510, and example ground connection pads 505, 507, 509, 508, 510, 514, 515, 517, 518 and 519 (collectively referenced by 205 henceforth unless explicitly stated otherwise). While one electronic component 510 is shown here for illustrative purposes, it is to be understood that there can be greater or fewer number of electrical components. The ground connection pads 505 can be electrically connected to the embedded ground plane 504 (not shown). The ground connection pads 505 serve for making electrical connection to the ribbon shielding structure 520.

Figure 6:
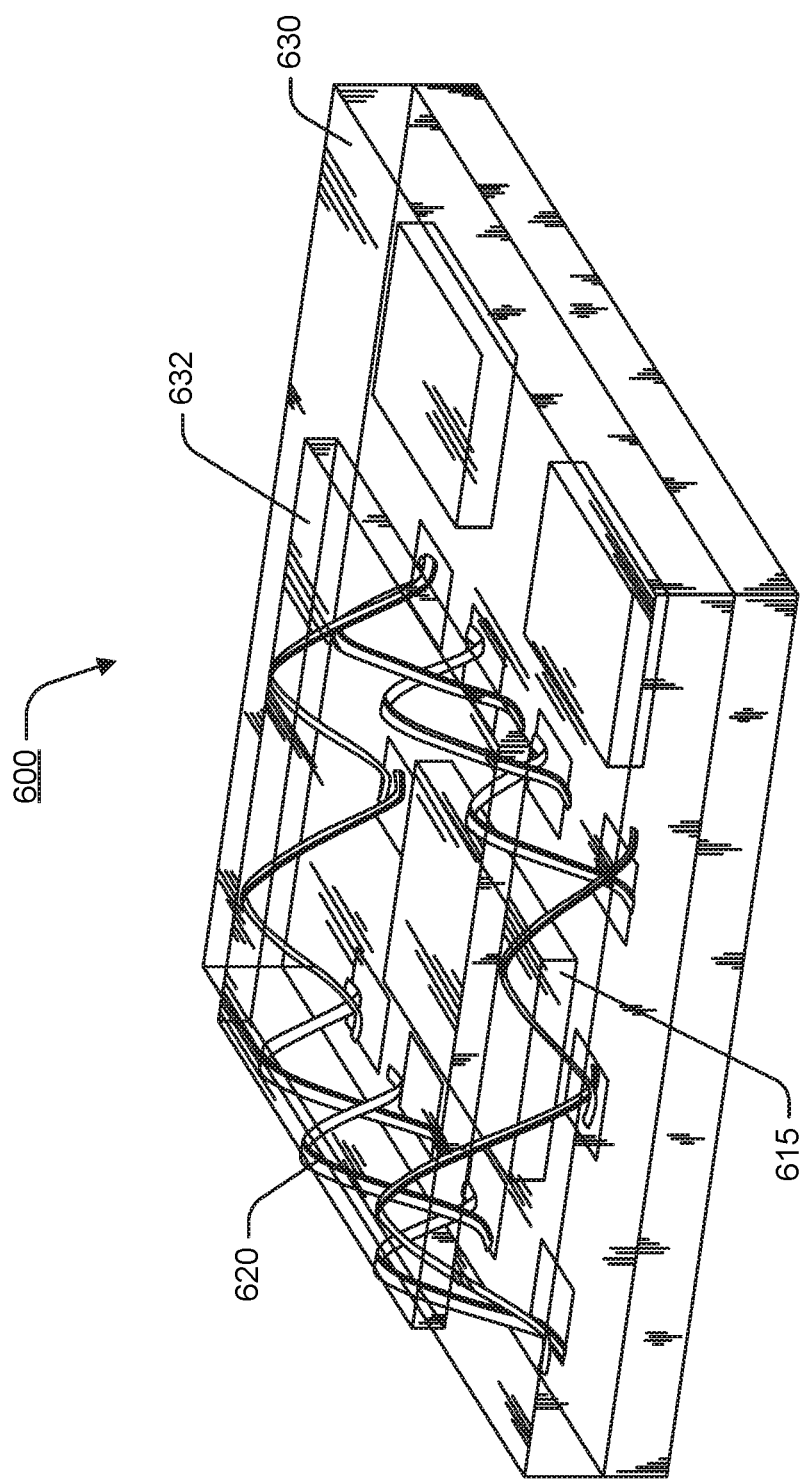
FIG. 6 depicts a simplified perspective view of an example semiconductor package with a ribbon shielding structure and a molding layer, in accordance with example embodiments of the disclosure.

FIG. 6 shows a simplified three-dimensional perspective view of a semiconductor package with EMI shielding 600 having molding layer 630 deposited on top of a substrate 603, a metal layer 632 deposited on top of the molding layer 630, an electronic component 615, and a wire shielding structure 620 for the electronic component 615. In some example embodiments, the molding layer 630 may provide structural support of the ribbon shielding structure 620 and for environmental protection. In some aspects, transfer molding can be used to add the molding layer 630. In other aspects, the molding layer 630 can be made partially or fully from a molding compound which may be any suitable molding material. The molding layer 630, in example embodiments, may be any suitable thickness. For example, the molding layer 630 may be approximately 1 mm thick. In other cases, the molding layer 630 may be approximately in the range between about 200 µm and 800 µm thick. In yet other cases, the molding layer 630 may be approximately in the range between about 1 mm and about 2 mm thick. In some embodiments, the metal layer 632 can be in electrical connection with the ribbon shielding structures 620. The metal layer 632 may be laminated on top of the molding layer 630. The metal layer 632 or metal laminate may be of any suitable material. In some example embodiments, the metal layer 632 may be a copper sheet. In other example embodiments, the metal layer 632 may be a gold sheet, a tin sheet, a silver sheet, combinations thereof, or the like. The metal sheet may be of any suitable thickness. In example embodiments, the metal layer 632 may be approximately in a range of about 25 µm to about 500 µm.

FIGS. 7A and 7B depict simplified cross-sectional schematic diagrams illustrating semiconductor packages 700 and 701 having any variety of electrical and mechanical coupling between the die and the semiconductor package having an EMI shielding structure, in accordance with example embodiments of the disclosure.

FIG. 7A depicts a simplified cross-sectional schematic diagram illustrating a semiconductor package 700 having a die 715 that is attached to a package substrate 703 using copper pillars 710. The substrate 700 may have a ground plane 704 and one or more ground connecting pads 705 and 707 provided on the surface of the substrate 703. The die 715 may be shielded by a wire or ribbon shielding structure 720. Moreover, the die 715 may be encapsulated by a molding layer (not shown).

The copper pillars 710 may be of any suitable size. For example, the copper pillars 710 may be approximately in the range of about 10 μm to about 150 μm in width. The die 715 may be aligned and attached to the substrate by any suitable mechanisms. For example, a thermosonic process may be used to fuse the copper pillars 710 to corresponding pads on the package substrate using gold/nickel, tin/lead, or any suitable metallurgy. As another example embodiment, a wave soldering process may be used to attach the die 715 to the substrate 703. In example embodiments, underfill material (not shown) may be provided around the copper pillars 710, between the die 715 and the substrate 703. Representative epoxy materials in the underfill may include an amine epoxy, imidizole epoxy, a phenolic epoxy or an anhydride epoxy. Other examples of underfill material include polyimide, benzocyclobutene (BCB), a bismaleimide type underfill, a polybenzoxazine (PBO) underfill, or a polynorbornene underfill. Additionally, the underfill material may include a filler material, such as silica. Underfill material may be introduced by spin coating, extrusion coating or spray coating techniques. In another embodiment, the underfill material includes a standard fabrication passivation material such as an inorganic passivation material (e.g., silicon nitride, silicon oxynitride) or organic passivation material (e.g., polyimide).

The substrate 703, as described above, may have build-up layers on either side of the substrate core. In some cases, a coreless package substrate 700 may be used. In example embodiments, contacts 725 for package level I/O may be provided on the substrate 703. The contacts 725 may be any suitable contacts, such as ball grid array (BGA) or other area array contacts 725.

FIG. 7B depicts a simplified cross-sectional schematic diagram illustrating a semiconductor package 701 having two dies 715, 716 that are attached to a package substrate 703 using wire bonds 722 in accordance with example embodiments of the disclosure. The substrate 703 may have a ground plane 704 and one or more connecting ground pads 705, 707 provided on the surface of the substrate 703. The die 715, 716 may be shielded by a wire or ribbon shielding structure 720. Moreover, the dies 715, 716 may be encapsulated by a molding layer (not shown). In example embodiments, contacts 725 for package level I/O may be provided on the substrate 703. The contacts 725 may be any suitable contacts, such as BGA or other area array contacts.

In various embodiments, the semiconductor package 701 may have any suitable number of dies stacked therein. The dies may be stacked in a manner by which the I/O contact pads of the dies are not occluded by other dies and/or components in the stacked die package. The dies may be stacked with adhesive disposed therebetween to hold the dies together. After stacking the dies, temporary wirebonds may be formed between the I/O pads of the dies of the stacked die package and/or with a dummy die that may be placed within the package.

The dies 715, 716 as packaged in the semiconductor package 701 may be any suitable type of die and may provide a SIP, in example embodiments. In some cases, the dies 715, 716 may be the same type of dies, such as memory dies (e.g., DRAM, SRAM, SDRAM, etc.) to form a stacked memory package. Other examples of homogeneous dies in the semiconductor package 701 may include stacked processors, stacked signal processors, or any other suitable homogeneous stacked die implementation. In other cases, the dies 715, 716 may be of different types. For example, a particular semiconductor package 701 may include a memory, a communications processor, a baseband processor, a power amplifier, a low noise amplifier, and/or other components of a communications device, such as a cellular telephone or a WiFi access point. As another non-limiting example, there may be a semiconductor package 701 with one or more microprocessor dies and one or more static random access memory (SRAM) dies where the one or more SRAM dies serve as level one (L1) or level two (L2) cache memory for the one or more microprocessor dies.

The dies may be any suitable electronic components including, but not limited to, integrated circuits, surface mounted devices, active devices, passive devices, diodes, transistors, connectors, resistors, inductors, capacitors, microelectromechanical systems (MEMSs), combinations thereof, or the like.

Figure 8:
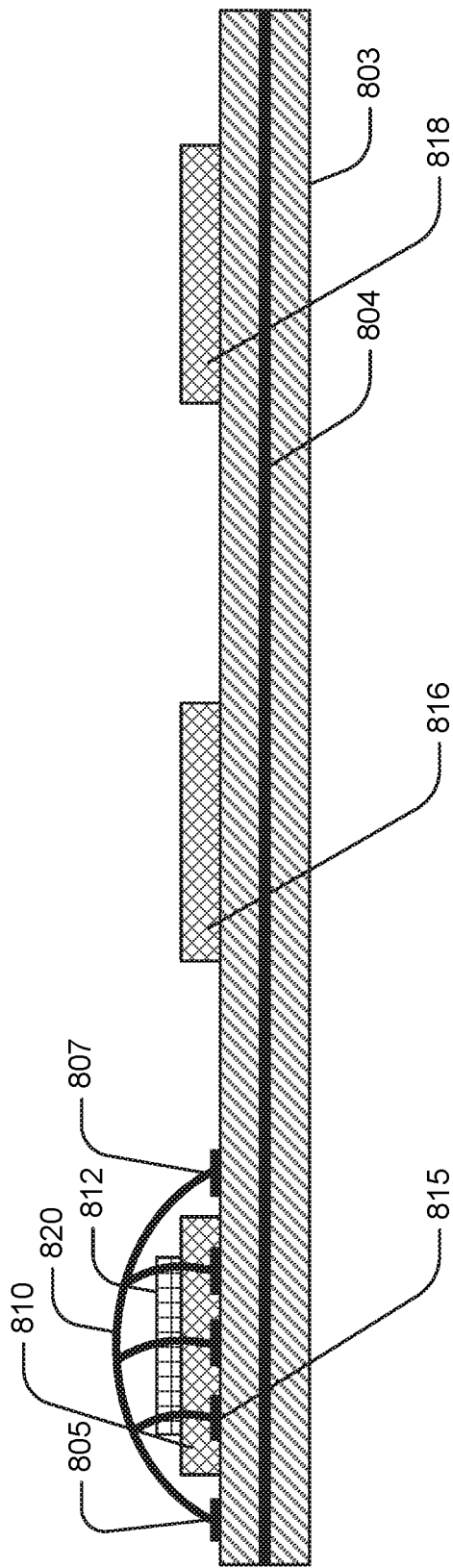
FIG. 8 depicts a simplified cross-sectional schematic diagram illustrating a system in a package (SiP) with EMI shielding around one or more electronic components, in accordance with example embodiments of the disclosure.

FIG. 8 shows an example of compartmental shielding, whereby one or more electronic components and/or dies (stacked in this case, but not necessary) 810, 812 among several electronic components 810, 812 is provided with the wire shielding structure 820 (or ribbon shielding structure, not shown). The space between chips in this example can be pre-determined such that neighboring electronic components (e.g. 816, 818) are offered additional protection from the electromagnetic radiation of the shielded electronic components 810, 812.

Figure 9:
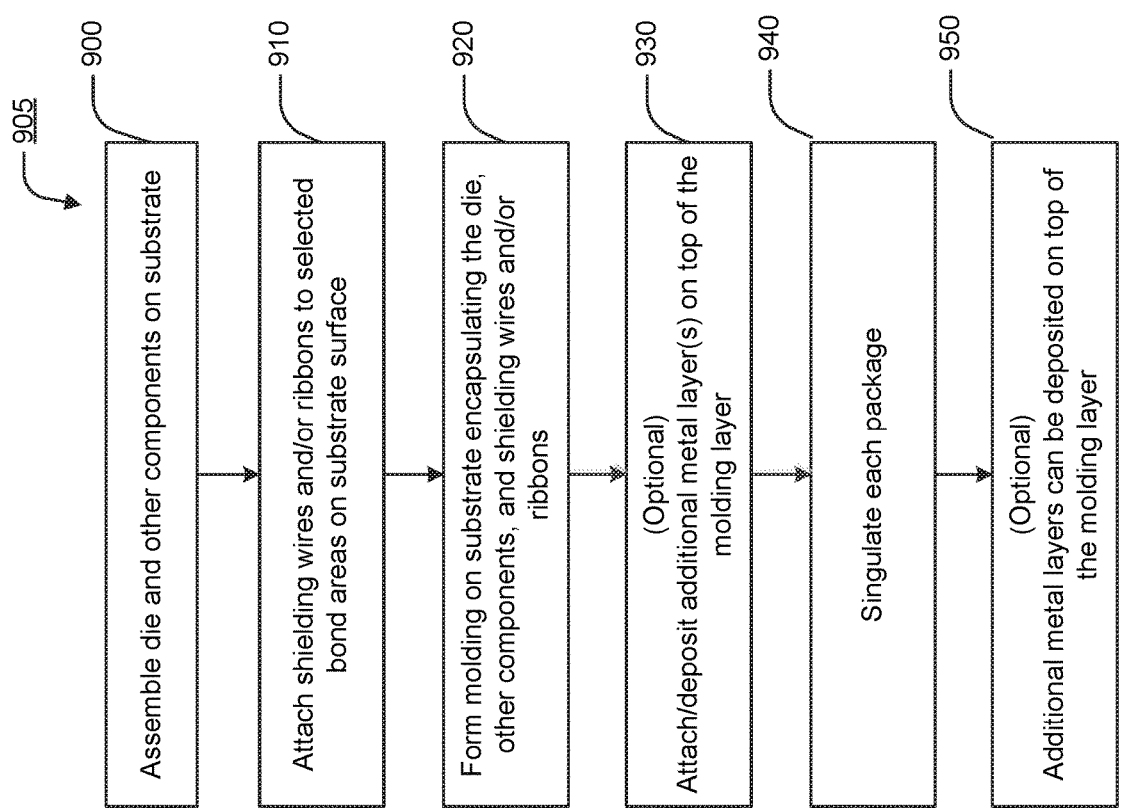
FIG. 9 depicts a flow diagram illustrating an example method for fabricating the semiconductor packages of FIGS. 1-8, in accordance with example embodiments of the disclosure.

FIG. 9 shows an example flow diagram 905 representative of the systems and methods described herein. FIG. 9 depicts a flow diagram illustrating an example method for fabricating the semiconductor packages of FIGS. 1-8, in accordance with example embodiments of the disclosure. At block 900, a die and other components are assembled on a substrate. This can be done, for example, via conventional semiconductor fabrication techniques common in the industry. At this point, the substrate may be a substrate panel on which multiple semiconductor packages are fabricated concurrently or nearly concurrently. The substrate (e.g., in panel form) may have build-up layers formed thereon and may be at a stage where the die and/or other structures may be formed thereon. The die may be any suitable electronic device, such as a semiconductor-based electronic device. In example embodiments, the die may be an integrated circuit (IC) with at least one active device (e.g., transistors, diodes, etc.) and/or passive device (e.g., resistors, inductors, capacitors, etc.). Next, at block 910, the shielding wires and/or ribbons can be attached to selected bond areas (e.g. ground connecting pads) on the substrate surface. At block 920, a molding layer can be formed on the substrate encapsulating the die, other components, and shielding wires and/or ribbons. Forming the molding layer may entail depositing a molding compound to a sufficient thickness to encapsulate the die and/or other components on the surface of the substrate. In example embodiments, the molding compound may be a thermosetting compound. In some cases, the molding compound may have one or more filler materials provided therein to engineer various physical, electrical, and/or thermal properties of the molding. After depositing the molding compound, a cure process may be performed to cross-link and/or harden the molding compound to form the molding. Optionally, at block 930, additional metal layers can be deposited and/or attached on top of the molding layer, e.g. the metal may be applied on the top surface of the molding. In example embodiments, the metal may be applied as a lamination sheet, such as a thin sheet of copper.

The lamination temperature to laminate the metal sheet may be approximately in the range of about 100° C. to about 250° C. In some example embodiments, the lamination temperature may be approximately in the range of about 150° C. to about 175° C. At block 940 the various electronic components and/or die and their respective ribbon and/or wire shielding structures, molding layer, and metal layers can be singulated in individual packages. Optionally at block 950, additional metal layers can be deposited and/or attached on top of the molding layer post-singulation. The singulation may be performed by any suitable mechanism, such as by laser ablation or saw cut. It should be noted, that the method 900 may be modified in various ways in accordance with certain embodiments of the disclosure. For example, one or more operations of the method 900 may be eliminated or executed out of order in other embodiments of the disclosure. Additionally, other operations may be added to the method 900 in accordance with other embodiments of the disclosure.

It will be appreciated that the apparatus described herein may be any suitable type of microelectronics packaging and configurations thereof, including, for example, system in a package (SIP), system on a package (SOP), package on package (PoP), interposer package, 3D stacked package, etc. In fact, any suitable type of microelectronic components may be provided in the semiconductor packages with EMI shielding, as described herein. For example, microcontrollers, microprocessors, baseband processors, digital signal processors, memory dies, field gate arrays, memory dies, logic gate dies, passive component dies, MEMSs, surface mount devices, application specific integrated circuits, baseband processors, amplifiers, filters, combinations thereof, or the like may be packaged in the semiconductor packages with EMI shielding, as disclosed herein. The semiconductor packages with EMI shielding, as disclosed herein, may be provided in any variety of electronic devices including, consumer, industrial, military, communications, infrastructural, and/or other electronic devices.

The semiconductor package with EMI shielding, as described herein, may be used to house one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system, and the one or more processors and any chipsets included in an electronic device may be from a family of Intel® processors and chipsets, such as the Intel® Atom® processor(s) family or Intel-64 processors (e.g., Sandy Bridge®, Ivy Bridge®, Haswell®, Broadwell®, Skylake®, etc.).

Additionally or alternatively, the semiconductor package with EMI shielding, as described herein, may be used to house one or more memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the semiconductor package with EMI shielding is provided may be a computing device. Such a computing device may house one or more boards on which the semiconductor package with EMI shielding may be disposed. The board may include a number of components, including but not limited to a processor and/or at least one communication chip. The processor may be physically and electrically connected to a board through, for example, electrical connections of the semiconductor package with EMI shielding. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

In an embodiment, a microelectronics package is described. The package can include a substrate having a top substrate surface, the top substrate surface having an electronic component provided thereon and one or more ground pads disposed on the substrate surface; and a shielding structure electrically connected to the one or more ground pads and mounted on the substrate surface and at least partially enclosing the electronic component, the shielding structure including a plurality of wires or a plurality of ribbons. The shielding structure can include the plurality of wires wire bonded to the one or more ground pads. The plurality of wires can include a first wire and a second wire, wherein a distance between the first wire and the second wire can be less than substantially half of a wavelength of a radiation to be rejected. The shielding structure can include the plurality of ribbons bonded to the one or more ground pads to form a plurality of bowed structures. The microelectronics package can include a molding layer encapsulating the electronic component and at least a portion of the shielding structure. The microelectronics package can include a metallic layer overlying the molding layer. The shielding structure can include a wire, wherein at least a portion of the wire can be in contact with the metallic layer. The microelectronics package can include a plurality of package-to-board electrical connections disposed on a bottom substrate surface of the substrate, the bottom substrate surface opposing the top substrate surface. The electronic component can be a first electronic component, wherein the microelectronic package can include a second electronic component provided on the top surface, wherein the second electronic component can be outside of the shielding structure.

In an embodiment, a method for fabricating a microelectronics package is described. The method can include: assembling at least one die on a substrate, the substrate having a top substrate surface, the top substrate surface having an electronic component mounted thereon and one or more ground pads disposed on the substrate surface; connecting a shielding structure to the one or more ground pads to partially enclose the at least one die; and providing molding that at least partially encapsulates the shielding structure and the electronic component. Connecting the shielding structure to the one or more ground pads can include bonding a plurality of wires to the one or more ground pads. At least a portion of the plurality of wires protrudes from a top surface of the molding. Assembling the at least one die on a substrate can include wire bonding a first plurality of wires on the top substrate surface, wherein connecting the shielding structure comprises wire bonding a second plurality of wires on the top substrate surface, and wherein the second plurality of wires have a greater loop height than the first plurality of wires. The shielding structure can be pre-formed. The plurality of wires can include a first wire and a second wire, wherein a distance between the first wire and the second wire can be less than substantially half of a wavelength of a radiation to be rejected. The electrically connecting a shielding structure to the ground pads can include bonding ribbons to the one or more ground pads to form a plurality of bowed structures. The method can further include forming a metallic layer on a top surface of the molding, wherein at least a portion of the shielding structure can be in contact with the metallic layer. At least a portion of the shielding structure protrudes from the molding and can be in contact with the metallic layer. Forming a metallic layer can include laminating a metal sheet on the top surface of the molding. The method can further include forming one or more package-to-board interconnects on a bottom substrate surface, the bottom substrate surface opposing the top substrate.

In an embodiment, an electronic device is described. The electronic device can include a microelectronics package, wherein the microelectronics package can include: a substrate having a top substrate surface, the top substrate surface having an electronic component provided thereon and one or more ground pads disposed on the substrate surface; and a shielding structure electrically connected to the one or more ground pads and mounted on the substrate surface and at least partially enclosing the electronic component, the shielding structure comprising a plurality of wires or a plurality of ribbons. The shielding structure can include the plurality of wires wire bonded to the one or more ground pads. The plurality of wires can include a first wire and a second wire, wherein a distance between the first wire and the second wire can be less than substantially half of a wavelength of a radiation to be rejected. The shielding structure can include the plurality of ribbons bonded to the one or more ground pads to form a plurality of bowed structures. The device can include a molding layer encapsulating the electronic component and at least a portion of the shielding structure. The device can include a metallic layer overlying the molding layer. The shielding structure can include a wire, wherein at least a portion of the wire can be in contact with the metallic layer. The device can include a plurality of package-to-board electrical connections disposed on a bottom substrate surface of the substrate, the bottom substrate surface opposing the top substrate surface. The electronic component can be a first electronic component, wherein the microelectronic package can include a second electronic component provided on the top surface, wherein the second electronic component can be outside of the shielding structure.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices, or systems and performing any incorporated methods and processes. The patentable scope of certain embodiments of the disclosure is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The claimed invention is:

1. A microelectronic device, comprising:
a substrate;
one or more outer perimeter wire shielding structures coupled to the substrate, the wire shielding structures including one or more bond wires forming loops, wherein at least two loops share a common bond pad, and overlap one another, wherein the at least two loops extend away from one another in opposite directions;
an electronic component located adjacent to the one or more outer perimeter ire shielding structures.

2. The microelectronics device of claim 1, wherein the one or more outer perimeter wire shielding structures are coupled to a ground source.

3. The microelectronics device of claim 2, wherein both ends of the one or more bond wires are coupled to the ground source.

4. The microelectronics device of claim 1, wherein the one or more outer perimeter wire shielding structures laterally encloses an area of the substrate that contains the electronic component.

5. The microelectronics device of claim 1, wherein the one or more bond wires includes one or more wire ribbon structures.

6. The microelectronics device of claim 1, wherein the one or more outer perimeter wire shielding structures form two or more sides of a rectangle on the substrate.

7. The microelectronics device of claim 1, further including a molding material covering the electronic component.

8. The microelectronics device of claim 7, further including a shield layer disposed over the molding material.

9. The microelectronics device of claim 8, wherein the shield layer is coupled to the one or more wire shielding structures.

10. A microelectronic device, comprising:
   a substrate;
   one or more outer perimeter wire shielding structures coupled to the substrate, the wire shielding structures including one or more bond wires forming loops on the outer perimeter, wherein at least two loops share a common bond pad, and overlap one another, wherein the at least two loops extend away from one another in opposite directions;
   an electronic component coupled to the substrate wherein the one or more outer perimeter wire shielding structures extend substantially an entire length of two or more sides of the electronic component.

11. The microelectronics device of claim 10, wherein the one or more outer perimeter wire shielding structures are coupled to a ground source.

12. The microelectronics device of claim 10, wherein both ends of the one or more bond wires are coupled to the ground source.

13. The microelectronics device of claim 10, wherein multiple bond wires are coupled to a common ground pad.

14. The microelectronics device of claim 10, wherein the one or more outer perimeter wire shielding structures form two or more sides of a rectangle on the substrate.

15. A wire shielding structure, comprising:
   one or more bond wires coupled to a surface of a substrate, the surface including a plurality of conductive features to electrically couple with a microelectronic device wherein the one or more bond wires form loops, wherein at least two loops share a common bond pad, and overlap one another, wherein the at least two loops extend away from one another in opposite directions;
   wherein the one or more bond wires are located adjacent to the plurality of conductive features.

16. The shielding structure of claim 15, wherein the plurality of conductive features includes a metal pad disposed on the surface, the metal pad to couple with a metal pillar or a solder bump extending from the microelectronic device.

17. The shielding structure of claim 15, wherein the plurality of conductive features includes a metal pad disposed on the surface, the metal pad to couple with a bond wire extending from the microelectronic device.

* * * * *